United States Patent [19]

Wagensonner et al.

[11] Patent Number: 4,481,530

[45] Date of Patent: Nov. 6, 1984

[54] COLOR FILTER ARRANGEMENT FOR OPTOELECTRIC CONVERTING DEVICES

[75] Inventors: Eduard Wagensonner, Aschheim; Ulrich Krekeler, Penzberg; Wolfgang Ruf, Munich, all of Fed. Rep. of Germany

[73] Assignee: Agfa-Gevaert Aktiengesellschaft, Leverkusen, Fed. Rep. of Germany

[21] Appl. No.: 380,014

[22] Filed: May 19, 1982

[30] Foreign Application Priority Data

May 26, 1981 [DE] Fed. Rep. of Germany ....... 3120849

[51] Int. Cl.$^3$ .............................................. H04N 9/04
[52] U.S. Cl. ......................................... 358/44; 358/41
[58] Field of Search ............................. 358/41, 43, 44

[56] References Cited

U.S. PATENT DOCUMENTS 4,288,812 9/1981 Rhodes ................................. 358/44

FOREIGN PATENT DOCUMENTS 1092881 11/1967 United Kingdom .................. 358/44

Primary Examiner—Michael A. Masinick
Attorney, Agent, or Firm—Michael J. Striker

[57] ABSTRACT

A color filtering device for a charge-coupled photoelectric converting device including a series of uniformly configured photoelectric converting elements which are sensitized by the filtering arrangement in the order of green, blue, green and red. The filtering arrangement includes a transparent filter carrier supporting a series of green, blue, green, red, blue, green, and so on, filtering elements. The active surface of each blue filtering element is equal to the active surface of the assigned photoelectric converting element. The green and red filtering elements are reduced in size in inverse proportion to the spectral sensitivity of the assigned photoelectric converting element. The resulting spacings between the elements are covered by an opaque masking layer, preferably of chromium.

6 Claims, 7 Drawing Figures

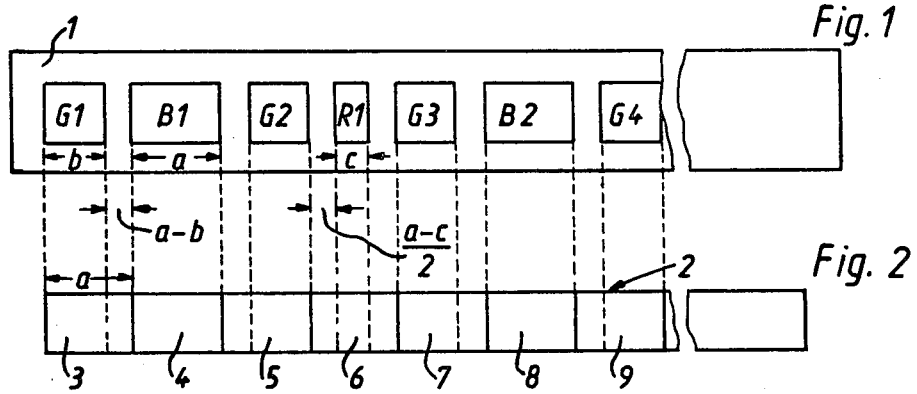
Fig. 1
Fig. 2
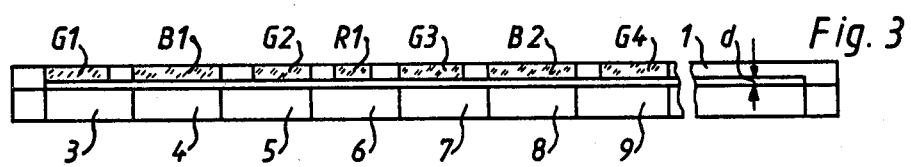
Fig. 3
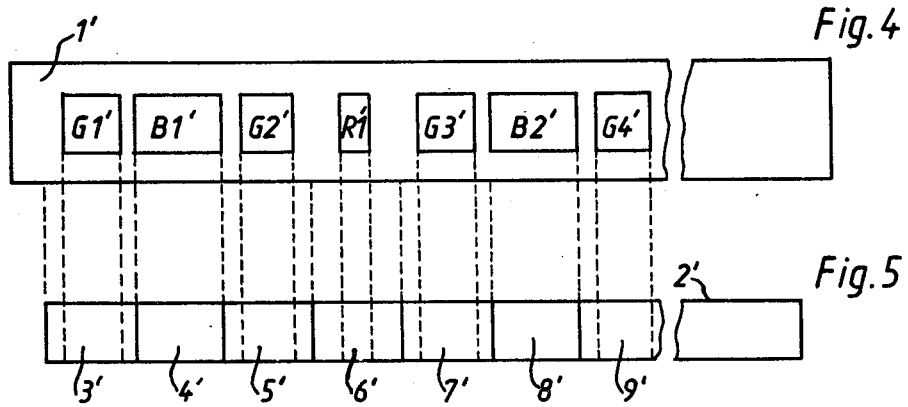
Fig. 4
Fig. 5
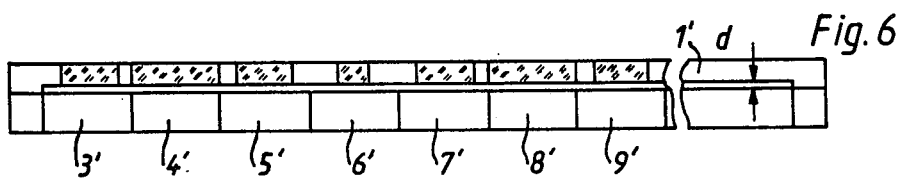
Fig. 6

COLOR FILTER ARRANGEMENT FOR OPTOELECTRIC CONVERTING DEVICES

BACKGROUND OF THE INVENTION

The present invention relates in general to color filtering systems and in particular to a color filtering arrangement for an optoelectric converting device, preferably of the type including a charge-coupled device (CCD) having a plurality of photoelectric converting elements of uniform shape arranged side-by-side and being sensitized in the order of green, blue-green and red colors. By means of this arrangement of converting elements, a received optical image is converted into corresponding electric picture-point signals which are processed in a video system in the predetermined order of green, blue-green and red picture-point signals.

The color filtering arrangement cannot be positioned in an arbitrary manner above the individual photoelectric converting elements of the CCD device, inasmuch as the danger of a cross-talk of color signals to the adjoining photoelectric converting elements might result. Also, it is of disadvantage that the spectral sensitivity of photoelectric converting elements is different. For instance, the proportion of spectral sensitivity of CCD converting elements for red, green and blue signals (wavelengths 600, 550 and 450 nm) is 48:38:17. This means that the spectral sensitivity of the CCD converter for the green signal is less by about a factor of 0.79 than for the red signal. Moreover, the spectral sensitivity of the CCD converter for the blue signals constitutes 35% of the spectral sensitivity for the red signal.

SUMMARY OF THE INVENTION

It is therefore a general object of the present invention to overcome the aforementioned disadvantages.

More particularly, it is an object of the invention to provide an improved color filtering arrangement of the above described type in which the danger of cross-talk of the signals between the adjoining CCD converting elements is substantially reduced or eliminated.

Another object of this invention is to reduce the effects of different sensitivities of the CCD converting elements.

In keeping with these objects, and others which will become apparent hereafter, one feature of the invention resides, in a color filtering arrangement of the aforedescribed type, in the provision of a transparent filter carrier superposed on the photoelectric converting elements, a plurality of filtering elements arranged consecutively in the predetermined order of green, blue-green and red elements on the carrier opposite the corresponding photoelectric converting elements, the surface of the blue filtering elements being equal to or smaller than the surface of the opposite blue-sensitive photoelectric converting elements, the surfaces of respective red and green filtering elements being smaller than that of the blue filtering elements in proportion to the difference in their spectral sensitivities, and masking means provided on the carrier between the filtering elements, the masking means defining opaque webs between said filtering elements corresponding in width to the size differences between respective filtering elements and the assigned photoelectric converting elements.

Of the three types of color filtering elements, the blue filtering element has the largest surface. Preferably, the surface of the blue filtering element corresponds in size to the surface of the photoelectric converting element (pixle). Due to the fact that the spectral sensitivity of the CCD photoelectric converting element for a blue signal is the lowest one, the size of this filtering element must be correspondingly increased to achieve an optimum sensitivity. In comparison with the size of this blue filtering element, the remaining filtering elements for the red and green color are correspondingly reduced in size. Of the latter two elements, the red filter element is again smaller in size than the green filter element. The surface differences among the three, blue, green and red, filtering elements reflect the differences of blue, green and red point-signals in the CCD photoelectric converting elements.

In this manner, a compensation of the spectral sensitivity among individual CCD converting elements is achieved. The CCD photoelectric converting elements, by themselves, have a uniform size. The blue filtering element is of the same size as the corresponding CCD photoelectric converting element. The red and green filtering elements, however, utilize only a portion of the active surface of the photoelectric converting elements. The remaining unused portions of the latter are optically covered by masking webs of light-impermeable material provided between the filtering elements. The width of these masking webs thus depends on the spectral sensitivity of two consecutive filtering elements. The advantage of the masking webs lies in the fact that they strongly reduce the danger of cross-talk, namely that the light bundle passing through a filtering element does not land on adjoining CCD photoelectric converting elements. A definite spacing between the CCD photoelectric converting elements and the assigned filtering elements is necessary, because the masking regions are of a light impervious metal layer, preferably chromium which must not be brought into contact with the CCD photoelectric elements.

In a further elaboration of this invention, the surfaces of the blue, green and red filtering elements are inversely proportional to the spectral sensitivity of the blue, green and red CCD photoelectric converting elements. In this manner the advantage is achieved that the spectral sensitivity of the CCD photoelectric converting elements for the red, green and blue signals is uniform.

According to another embodiment of this invention, the width of the masking webs between the individual blue, green and red filtering elements is proportional to the differences of spectral sensitivity between the corresponding CCD photoelectric converting elements. Preferably, in the succession of green, blue-green and red filtering elements, the maximum clearance is between the green and blue filtering elements. By virtue of this arrangement, it is achieved that the influence of green signals on the CCD photoelectric converting elements sensitive to blue signals is extremely low.

The novel features which are considered characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

FIG. 1 is a plan view of a first embodiment of the filtering arrangement of this invention;

FIG. 2 is a series of photoelectric converting elements in the embodiment of FIG. 1;

FIG. 3 is a side view of the embodiment of FIG. 1;

FIG. 4 is a plan view of another embodiment of the filtering arrangement according to this invention;

FIG. 5 is a series of photoelectric optical elements in the embodiment of FIG. 4;

FIG. 6 is a side view of the embodiment of FIG. 4; and

DESCRIPTION OF THE PREFERRED EMBODIMENTS

Figure 7:
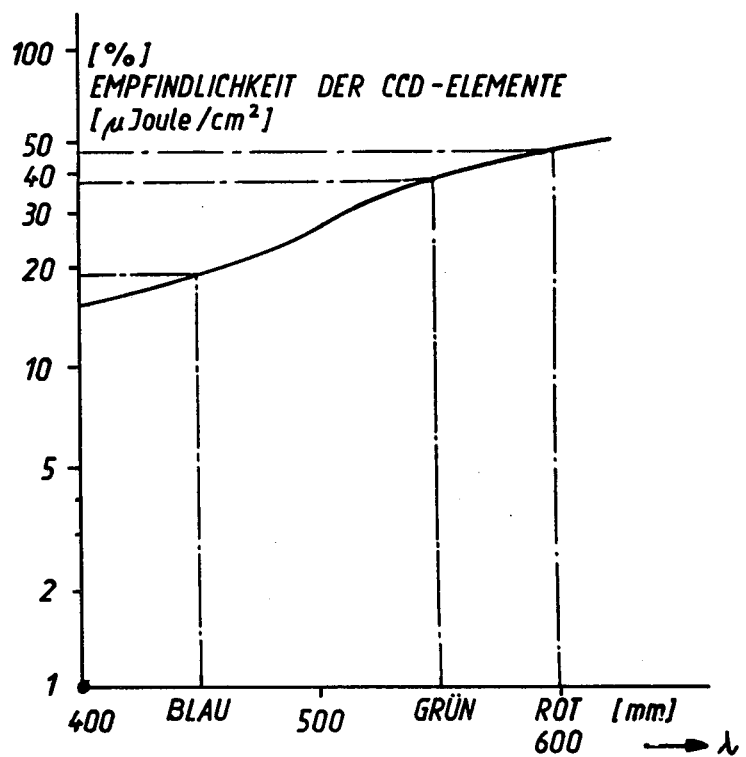
FIG. 7 is a plot diagram of the spectral sensitivity of CCD photoelectric converting elements.

Referring firstly to FIGS. 1–3, reference numeral 1 indicates a color filter arrangement including a row of consecutively arranged sets of filtering elements G1, B1, G2, R2; G3, B2, G4, and so on, whereby in each set the elements are arranged in the order green, blue, green and red. The assigned sets of corresponding CCD photoelectric converting elements 3–9 are indicated by reference numeral 2. The size of all CCD elements is uniform.

From FIG. 3 it will be seen that the facing surface areas of filtering elements 1 and of the underlying photoelectric converting elements 3–9 are spaced apart by a clearance "b". The longitudinal dimension of individual photoelectric converting elements is "a".

Due to the fact that the CCD photoelectric converting elements 4 and 8 for the blue signal possess the lowest spectral sensitivity, as is apparent from FIG. 7, it is necessary to make the effective surface area of this blue-sensitive CCD converting elements 4 and 8 equal to the effective surface areas of corresponding blue filtering elements B1 and B2, so as to achieve optimum results.

The green filtering elements G1, G2, G3 and G4, which as seen from FIG. 7 have a sensitivity which is larger than the sensitivity of the blue filtering elements but lower than that of the red filtering elements, have an active surface area which is dimensioned proportionally to the sensitivity ratios, namely it is smaller than the active surface area of the assigned CCD green-sensitive elements. In this example, the active surface area of filtering elements amounts to about 79% of the active surface area of the corresponding CCD photoelectric elements. While the width of all filtering elements is the same, the lengths of green filtering elements G1, G2, G3 and G4 amount to 79% of the lengths of the blue filtering elements B1 and B2.

The CCD photoelectric elements 6 for the red signals possess the largest spectral sensitivity, the active surface area of red filtering elements R1, R2, and so on, being reduced proportionally to the increased spectral color sensitivity. In this example, the active surface area of the red filtering elements amounts to 35% of that of the blue filtering elements. Similarly, the length c of each red filtering element is 35% of the length a of respective blue filtering elements.

In the embodiment of this invention according to FIGS. 1–3, the green filtering elements G1, G2, G3 and G4 are situated with respect to their assigned green-signal electrooptical elements 3, 5, 7 and 9 in such a manner that their edges remote from the adjoining blue filtering elements are in register with the edges of underlying CCD electrooptical converting elements 3, 5, 7 and 9. The red filtering elements R1, and so on, are located symmetrically with respect to the adjoining groups of green, blue and green filtering elements, and also to the corresponding CCD photoelectric elements. In this manner there result optimum spacings between the consecutive color filtering elements which are coated with chromium to create light-impervious masking webs therebetween. In the preferred embodiment, the filtering arrangement 1 includes a glass filter carrier, upon which both the filtering surfaces and the opaque chromium mask ranges are deposited by evaporation.

In the embodiment of the filtering device of this invention according to FIGS. 4–6, the parts corresponding to the first embodiment are designated by like reference numerals, provided with primes. The difference between these two embodiments is the spacing between the individual color filtering elements G1', B1', G2' and R1'. In this second embodiment, both the green filtering elements G1', G2', G3', G4' are situated symmetrically to the center of the assigned CCD photoelectric converting elements 3', 5', 7' and 9'. Accordingly, in comparison with the preceding example, the clearance between the consecutive green filtering elements G1', B1' and G2' is reduced, whereas the clearance between the consecutive green filtering elements G2', R1' and G3' is increased.

It will be understood that each of the elements described above, or two or more together, may also find a useful application in other types of constructions differing from the types described above.

While the invention has been illustrated and described as embodied in a particular example of the color filtering arrangement, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

We claim:

1. A color filter arrangement for an optoelectric converting device, preferably a charge-coupled photoelectric device including a plurality of uniformily shaped photoelectric converting elements arranged side-by-side in a series and being sensitized to green, blue, green and red colors and by means of which a received optical image is converted into corresponding electric picture-point signals, the signals being processed in a video system in the predetermined order of green, blue, green and red picture-point signals, the filter arrangement comprising a transparent filter carrier superposed on said photoelectric converting elements; a plurality of color filtering elements arranged one after the other in said predetermined green, blue, green and red sequence on said carrier opposite the corresponding photoelectric converting elements; the surface area of said blue filtering elements being equal to or smaller than the surface area of the opposite blue-sensitive photoelectric converting elements; the surface areas of respective red and green filtering elements being smaller than the surface areas of the blue filtering elements in proportion to the difference in the spectral sensitivites of the photoelectric converting elements; and opaque masking means provided on said carrier, said masking means defining opaque webs between the consecutive filtering elements, the webs corresponding in width to the size differences between respective filtering elements and the assigned photoelectric converting elements.

2. A color filter arrangement according to claim 1, wherein said masking means consists of a chromium layer which is spaced apart from the underlying photoelectric converting elements.

3. A color filter arrangement as defined in claim 1, wherein the surface area of the blue, green and red filtering elements are inversely proportional in size to the spectral sensitivity of corresponding blue, green and red photoelectric converting elements.

4. A color filter arrangement as defined in claim 1, wherein the width of the opaque masking webs between the individual blue, green and red filtering elements is increased proportionally to the difference between the spectral sensitivities of the corresponding converting elements.

5. A color filtering arrangement according to claim 1, wherein in the sequence of green, blue, green and red filtering elements, the clearance between the green and blue filtering elements is smaller than the clearance between the green and red filtering elements.

6. A color filtering arrangement as defined in claim 1, wherein the clearance between said filtering elements is substantially uniform.

* * * * *